United States Patent [19]
Shinmura

[11] Patent Number: 5,985,756
[45] Date of Patent: Nov. 16, 1999

[54] METHOD OF FORMING AN INTERCONNECTION IN A CONTACT HOLE IN AN INSULATION LAYER OVER A SILICON SUBSTRATE

[75] Inventor: Toshiki Shinmura, Tokyo, Japan

[73] Assignee: NEC Corporation, Tokyo, Japan

[21] Appl. No.: 08/884,035

[22] Filed: Jun. 27, 1997

[30] Foreign Application Priority Data

Jun. 27, 1996 [JP] Japan .................................. 8-167382

[51] Int. Cl.$^6$ ............................................. H01L 21/4763
[52] U.S. Cl. ........................................... 438/648; 438/649
[58] Field of Search .................................. 438/648, 649, 438/652, 653, 655, 656, 660, 664, 668

[56] References Cited

U.S. PATENT DOCUMENTS

| | | | |
|---|---|---|---|
| 5,136,362 | 8/1992 | Grief et al. | 357/67 |
| 5,529,670 | 6/1996 | Ryan et al. | 204/192.15 |
| 5,565,708 | 10/1996 | Ohsaki et al. | 257/764 |
| 5,654,233 | 8/1997 | Yu | 438/643 |
| 5,739,573 | 4/1998 | Kawaguchi | 257/384 |
| 5,747,384 | 5/1998 | Miyamoto | 438/685 |
| 5,801,096 | 9/1998 | Lee et al. | 438/636 |

FOREIGN PATENT DOCUMENTS

| | | |
|---|---|---|
| 0 506 129 | 9/1992 | European Pat. Off. . |
| 0 512 296 | 11/1992 | European Pat. Off. . |
| 6-140359 | 5/1994 | Japan . |
| 7-106281 | 4/1995 | Japan . |
| 7-201993 | 8/1995 | Japan . |

*Primary Examiner*—Joni Chang
*Attorney, Agent, or Firm*—Young & Thompson

[57] ABSTRACT

A method of forming an interconnection within a high aspect ratio contact hole includes, forming a contact hole in an insulation film over a silicon substrate so that a diffusion layer, formed on a surface of the silicon substrate, is shown through the contact hole, removing spontaneous oxide film from a surface of the diffusion layer shown through the contact hole, heating at a temperature in the range of 350° C. to 450° C. the substrate to deposit a titanium film having a first thickness t1 by a collimated sputtering method, heating the substrate to deposit a titanium nitride film having a second thickness t2 by a collimated sputtering method, and heating the substrate to cause a titanium silicidation reaction at a boundary between the titanium film and the silicon diffusion layer thereby forming a titanium silicide film on the silicon diffusion layer at the bottom of the contact hole. Thereafter, a conductive film is formed which covers the titanium nitride film. Laminations of the conductive film, the titanium nitride film and the titanium film are patterned to form an interconnection in the contact hole.

7 Claims, 8 Drawing Sheets

METHOD OF FORMING AN INTERCONNECTION IN A CONTACT HOLE IN AN INSULATION LAYER OVER A SILICON SUBSTRATE

BACKGROUND OF THE INVENTION

The present invention relates to a method of forming a semiconductor device, and more particularly to a method of forming an interconnection in a contact hole formed in an insulation layer over a silicon substrate.

In recent years, high density and three-dimensional integration of the semiconductor device has been increasingly under development. A contact hole is formed in an insulation layer which extends over a silicon substrate. An interconnection is formed which extends over the insulation layer and within the contact hole so that the interconnection is connected through the contact hole to a semiconductor element formed on a surface of the silicon substrate. For the high density and three-dimensional integration, an aspect ratio of the contact hole is required to be high wherein the aspect ratio is defined as a ratio of a depth to an opening diameter of the contact hole. If an aluminum-based metal interconnection is formed in the high aspect ratio contact hole by the normal sputtering method, a disconnection of the aluminum-based metal interconnection may appear on side walls of the high aspect ratio contact hole.

In order to solve this problem, it was proposed that a tungsten interconnection be formed by a blanket chemical vapor deposition method in place of the above aluminum-based metal interconnection.

If the tungsten interconnection is formed by the blanket chemical vapor deposition method, it is required that the tungsten interconnection film be connected through a conductive barrier layer to a diffusion region formed on the surface of the silicon substrate for the purpose of suppression of the excess diffusion of tungsten into the diffusion layer. As the barrier layer, laminations of titanium films and titanium nitride films are available. If the titanium film is deposited by the normal sputtering method at room temperature, the titanium film formed on the side walls of the high aspect ratio contact hole is not a continuous film but includes large size titanium grains discontinuously, for which reason this tungsten film is likely to be peeled from the side walls of the contact hole by a subsequent heat treatment. It is thus difficult to fill the high aspect ratio contact hole with the titanium film completely.

In order to settle the above problem, the following method was proposed which is also disclosed in the Japanese laid-open patent publication No. 7-106281. The conventional method will be described with reference to FIGS. 1A through 1E.

Figure 1A:
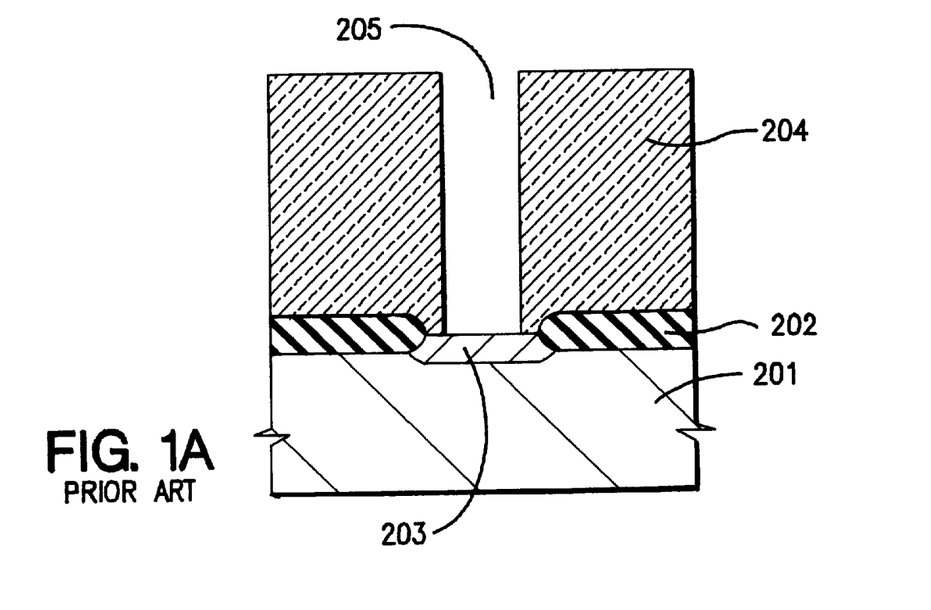
FIGS. 1A through 1E are fragmentary cross sectional elevation views illustrative of an interconnection within a contact hole in an insulation layer over a silicon substrate in sequential steps involved in the conventional fabrication method in accordance with the present invention.

With reference to FIG. 1A, field oxide films 202 are selectively formed on a surface on a silicon substrate 201 so that the field oxide films 202 surround an active region of the surface of the silicon substrate 201. A diffusion layer 203 is formed on the active region of the surface of the silicon substrate 201. An insulation film 204 having a thickness of 1 micrometer is deposited by a chemical vapor deposition method so that the insulation film 204 extends over the field oxide films 202 and the diffusion layer 203. A contact hole 205 is formed in the insulation film 204 so that the diffusion layer 203 is shown through the contact hole 205. The contact hole 205 has an opening diameter of 0.35 micrometers.

Figure 1B:
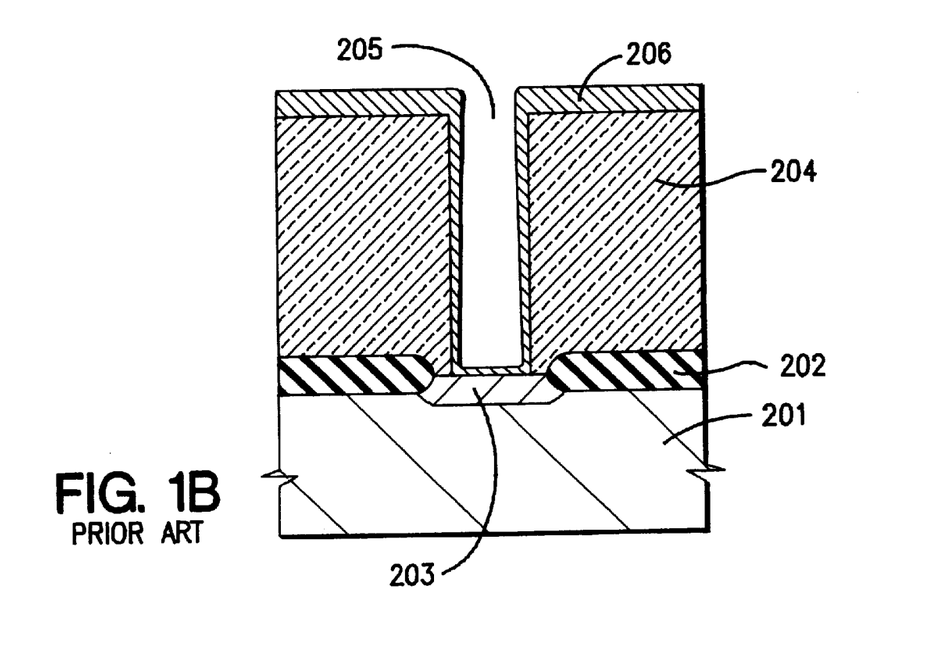

With reference to FIG. 1B, a titanium film 206 having a thickness of about 100 nanometers is deposited on the insulation film 204 and on the side walls of the contact hole 205 as well as on the diffusion layer 203 by a sputtering method at a substrate temperature in the range of 350° C. to 450° C. The titanium film 206 extends continuously not only over the insulation film 204 but also on the vertical side walls of the contact hole 205. This allows the tungsten film to be filled within the contact hole and prevents the tungsten film from being peeled from the side walls of the contact hole 205. The thickness of the titanium film 206 over the insulation film 204 is thick to secure the thickness of the titanium film 206 which covers the diffusion layer 203 at the bottom of the contact hole 205. The thickness of the titanium film 206 which covers the diffusion layer 203 is 4 nanometers.

Figure 1C:
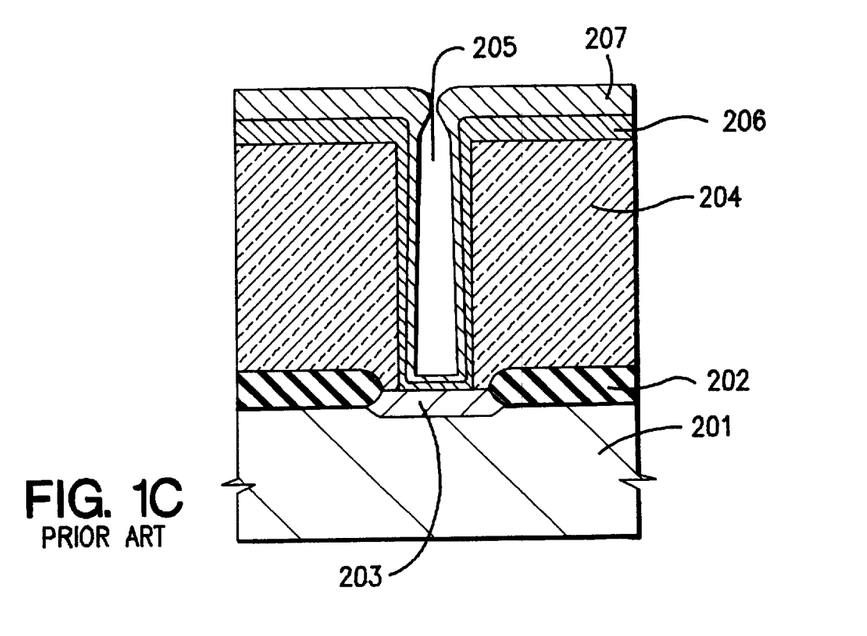

With reference to FIG. 1C, when the silicon substrate 201 is held at room temperature, a titanium nitride film 207 having a thickness of 50 nanometers is formed. A conductive barrier film comprising laminations of a titanium film 206 and a titanium nitride film 207 has a thickness of 150 nanometers over the insulation film 204.

Figure 1D:
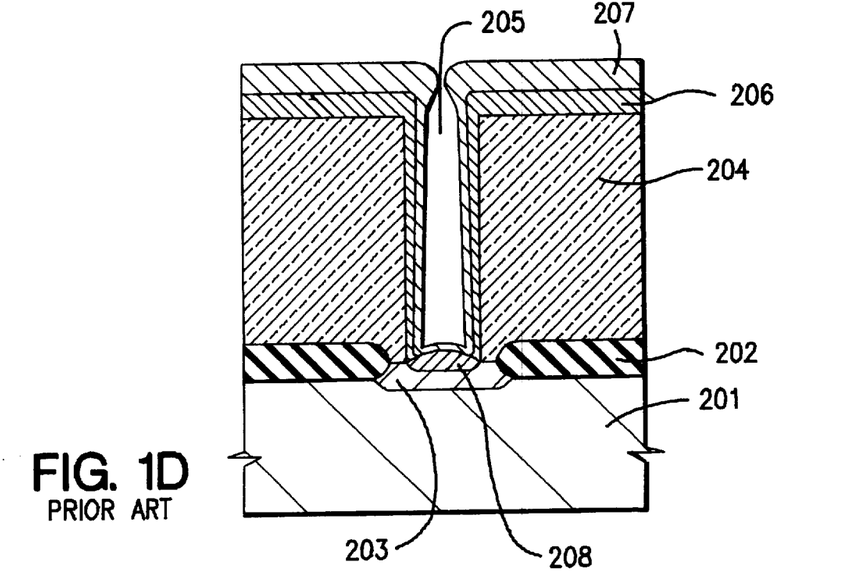

With reference to FIG. 1D, a lamp anneal is carried out at 700° C. for 30 seconds to cause a titanium silicidation of the titanium film 206 having the thickness of about 4 nanometers covering the diffusion layer 203 to form a C49-structured titanium disilicide film 208 having a thickness of 12 nanometers.

Figure 1E:
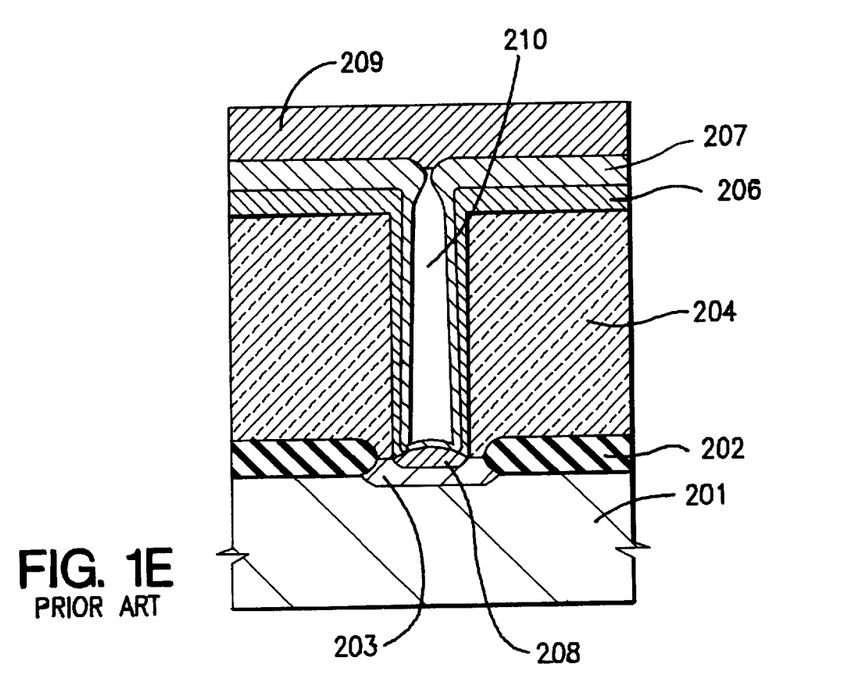

With reference to FIG. 1E, a tungsten film 209 is entirely formed by the blanket chemical vapor deposition. Laminations of the tungsten film 209, the titanium nitride film 207 and the titanium film 206 are patterned to form interconnections.

The above conventional method has the following two problems. The titanium nitride film 207 formed under the above conditions and covering the diffusion layer 203 has a thickness of 2 nanometers, which is insufficient as a barrier layer. The titanium nitride film 207 is required to have a thickness of at least about 10 nanometers in order to prevent that the titanium film 206 reacts with a source gas $WF_6$ at the bottom of the contact hole 203 during formation of the titanium film 206 whereby titanium fluoride and prevent that the tungsten film 209 is diffused through the titanium silicide film 208 into the diffusion layer 203. If the aspect ratio of the contact hole 205 is 2.85, then the minimum thickness of the titanium nitride film 207 over the insulation film 204 is about 250 nanometers. In order to secure the ohmic contact of the tungsten film 209 and the diffusion layer 203 at the bottom of the contact hole 205, at least 10 nanometers thickness of the titanium silicide film 208 is needed, for which reason the titanium film 206 covering the diffusion layer 203 at the bottom of the contact hole 205 is required to be at least 3.3 nanometers. If the aspect ratio of the contact hole 205 is about 2.85, then the minimum thickness of the titanium film 206 over the insulation layer 204 is about 83 nanometers. The conductive barrier film comprising the titanium film 206 and the titanium nitride film 207 at the bottom of the contact hole is required to have a thickness of at least 333 nanometers over the insulation film 204 for allowing the conductive barrier film to have the barrier and ohmic properties. If the conductive barrier film has a thickness of 300 nanometers or more over the insulation film 204 and the tungsten film 209 is formed on the conductive barrier film for subsequent patterning the same, then it is difficult to keep the pattern of the photo-resist because the etching rate of the conductive barrier film is not high with reference to that of the resist film. This makes it difficult to obtain desired interconnections. It is difficult to satisfy both the requirements for obtaining the barrier ability and for accurate patterning of the interconnection layers.

The second problem is concerned with the shape of the titanium nitride film 207. With reference to FIG. 1D, if the titanium nitride film 207 is formed by the above conventional method, then the titanium nitride film 207 has an overhang shape at the top edges of the contact hole 205 whereby due to shadowing effect, growth of the titanium nitride film 207 on the side walls and the bottom of the contact hole 205 is prevented. As a result, it is difficult to fill the contact hole 205 with the tungsten film 209 and in place a cavity 210 is formed in the contact hole 205 thereby resulting in deterioration of the electrical connection of the interconnection and the diffusion layer 203.

Collimated sputtering method is effective in order to solve the above first problem but not effective to the second problem.

SUMMARY OF THE INVENTION

Accordingly, it is an object of the present invention to provide a novel method of forming interconnections within a high aspect ratio contact hole, free from the above problems.

It is a further object of the present invention to provide a novel method of forming interconnections within a high aspect ratio contact hole wherein a conductive barrier film has a satisfactory barrier ability and an satisfactory ohmic property.

It is a still further object of the present invention to provide a novel method of forming interconnections within a high aspect ratio contact hole to allow an accurate patterning to the interconnections.

It is yet a further object of the present invention to provide a novel method of forming interconnections within a high aspect ratio contact hole to prevent disconnection of the interconnection.

The above and other objects, features and advantages of the present invention will be apparent from the following descriptions.

The present invention provides a novel method of forming an interconnection within a contact hole of a high aspect ratio. The method comprises the following steps. A contact hole is formed in an insulation film over a silicon substrate so that a diffusion layer formed on a surface of the silicon substrate is shown through the contact hole. A spontaneous oxide film is removed from a surface of the diffusion layer shown through the contact hole. The substrate is heated at a temperature in the range of 350° C. to 450° C. to deposit a titanium film having a first thickness t1 by a collimated sputtering method. The silicon substrate is heated to deposit a titanium nitride film having a second thickness t2 by a collimated sputtering method. The substrate is heated to cause a titanium silicidation reaction at a boundary between the titanium film and the silicon diffusion layer thereby forming a titanium silicide film on the silicon diffusion layer at the bottom of the contact hole. A conductive film is formed which covers the titanium nitride film. Laminations of the conductive film, the titanium nitride film and the titanium film are patterned to form an interconnection in the contact hole.

It is preferable that the titanium nitride film is deposited at a substrate temperature in the range of 300° C. to 450° C., t1 is not less than 9 nanometers and t2 is not less than 29 nanometers and further the sum of t1 and t2 is less than 300 nanometers.

BRIEF DESCRIPTIONS OF THE DRAWINGS

Preferred embodiments of the present invention will be described with reference to the accompanying drawings.

PREFERRED EMBODIMENT

A first embodiment according to the present invention will be described. FIGS. 2A through 2E are fragmentary cross sectional elevation views illustrative of an interconnection within a contact hole in an insulation layer over a silicon substrate in sequential steps involved in a novel fabrication method in accordance with the present invention. FIG. 3 is a diagram illustrative of a bottom coverage versus aspect ratio of contact hole in normal and collimated sputtering methods in accordance with the present invention. FIGS. 4A through 4E are fragmentary cross sectional elevation views illustrative of mohology or fine structure of titanium film at different temperatures in accordance with the present invention. FIG. 5 is a block diagram illustrative of a collimate sputtering system used in accordance with the present invention.

The bottom coverage means a ratio in thickness of the film over an insulation film to the film at the bottom of a contact hole. There is almost no difference in dependence of bottom coverage to aspect ratio between a titanium film and a titanium nitride film. The dependence of the bottom coverage to aspect ratio almost does not depend upon a growth temperature.

Figure 2A:
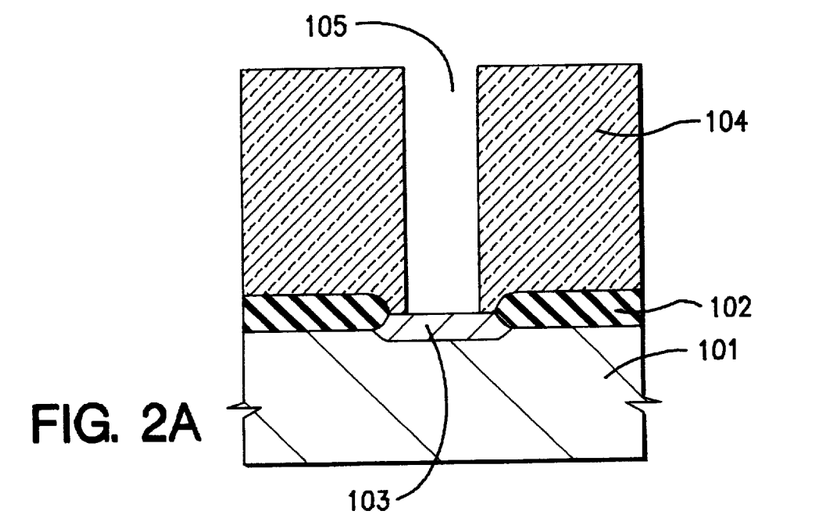
FIGS. 2A through 2E are fragmentary cross sectional elevation views illustrative of an interconnection within a contact hole in an insulation layer over a silicon substrate in sequential steps involved in a novel fabrication method in accordance with the present invention.
Figure 3:
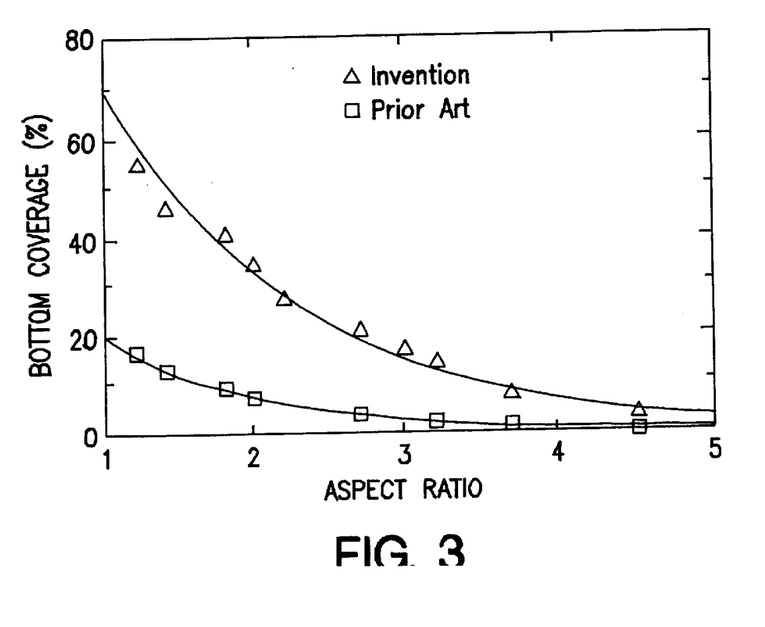
FIG. 3 is a diagram illustrative of a bottom coverage versus aspect ratio of contact hole in normal and collimated sputtering methods in accordance with the present invention.

With reference to FIG. 2A, field oxide films 102 are selectively formed on a surface on a silicon substrate 101 so that the field oxide films 102 surround an active region of the surface of the silicon substrate 101. A diffusion layer 103 with a depth of 200 nanometers is formed on the active region of the surface of the silicon substrate 101. An insulation film 104 having a thickness of 1 micrometer is deposited by a chemical vapor deposition method so that the insulation film 104 extends over the field oxide films 102 and the diffusion layer 103. A contact hole 105 is formed in the insulation film 104 so that the diffusion layer 103 is shown through the contact hole 105. The contact hole 105 has an opening diameter of 0.25 micrometers. The high aspect ratio is in the range of 2–5, and preferably 3–5.

A spontaneous oxide film is removed from the surface of the diffusion layer 103 by a diluted hydrofluoric acid solution or an argon-hydrogen plasma reduction reaction.

Figure 2B:
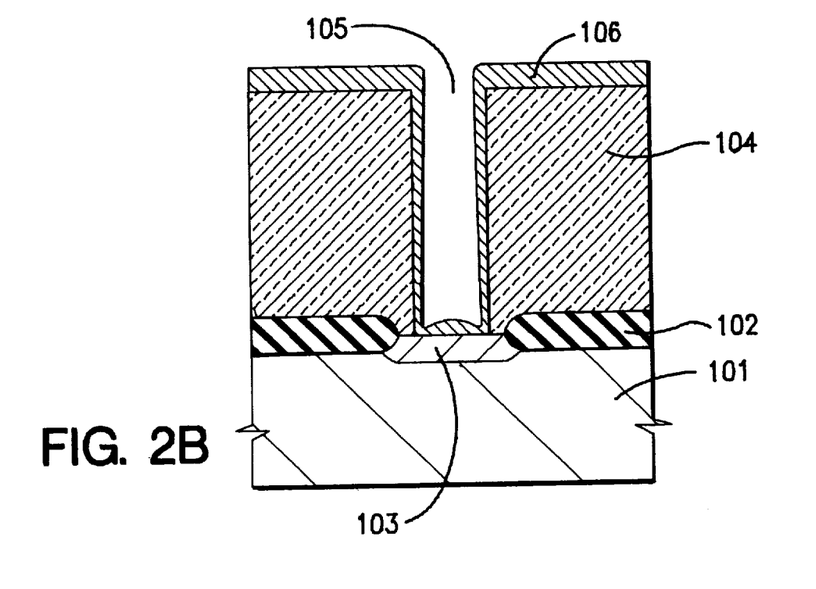

With reference to FIG. 2B, by use of a collimate sputtering chamber as illustrated in FIG. 5, a titanium film 106 is deposited on the insulation film 104 and on the side walls of the contact hole 105 as well as on the diffusion layer 203 by a collimated sputtering method at a substrate temperature in the range of 350° C. to 450° C. The deposited titanium film 106 over the insulation layer 104 has a thickness t1 which is more than 9 nanometers. The sputtering chamber has the structure as illustrated in FIG. 5.

With reference to FIG. 5, in a sputter chamber 161, a titanium target 162, a collimator 163, a substrate holder 164 containing a heater, a mass flow controller 166, a gas introduction port 167, an insulator 168, a backing plate 169, a magnet 171, a shield 173, and an discharge port 174. A silicon substrate 101 is mounted on the substrate holder 164. An internal pressure of the sputter chamber 161 is maintained in the order of $1\times10^{-6}$ Pa except in sputtering process so as to reduce influence of oxygen. In the sputtering process, Ar gas is introduced through the gas introduction port 167 into the sputter chamber 161 wherein the mass flow controller 166 controls a gas flow rate so that the internal pressure of the sputter chamber 161 is set at about 0.4 Pa. In this state, a high voltage power 172 applies a voltage of 500 V to the sputter chamber 161 for causing a plasma to carry out a collimated sputtering.

A collimator 163 provided between the silicon substrate 101 and a titanium target 162 has fine through holes, each of which has an aspect ratio of 1.5 as a ratio of depth to opening diameter. In the collimated sputtering process, particles sputtered in a direction tilted by 33.7 degrees or more from the direction toward the target will be captured by the collimator 163. If the through holes of the collimator 163 has an aspect ratio of 1.0, then particles sputtered in a direction tilted by 45 degrees or more from the direction toward the target will be captured by the collimator 163, for which reason most of the particles having passed through the collimator 163 can achieve the bottom of the contact hole.

With reference to FIG. 3, if the aspect ratio is in the range of 2–5, then the bottom coverage is in the range of 35%–5%, for which reason in order to deposit a titanium film 106 having a thickness of 3.3 nanometers on the bottom of the contact hole, it is required that the thickness t1 of the titanium film 106 over the insulation layer 104 is in the range of 9 nanometers to 66 nanometers. The maximum value of the thickness t1 of the titanium film 106 over the insulation layer 104 is limited by both the thickness limitation of not more than 300 nanometers for accurate patterning and thicknesses of the titanium silicide film 108 over the diffusion layer 103 at the bottom of the contact hole 105. The maximum thickness of the titanium silicide film 108 is limited at about 240 nanometers in consideration of the junction depth of the diffusion layer 103. In the light of the above matters, the maximum thickness of the titanium film at the bottom of the contact hole 105 is about 80 nanometers. If the aspect ratio is 2, the maximum thickness t1 of the titanium film 106 over the insulation layer 104 is about 230 nanometers.

Figure 4A:
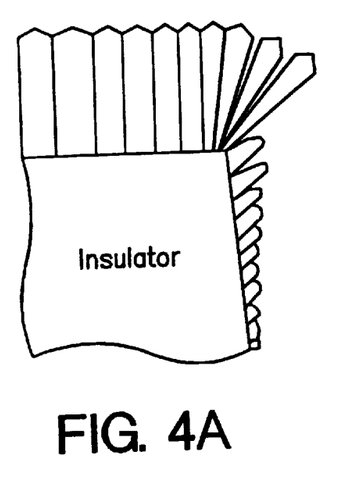
FIGS. 4A through 4E are fragmentary cross sectional elevation views illustrative of mohology or fine structure of titanium film and titanium nitride film at different temperatures in accordance with the present invention.
Figure 4B:
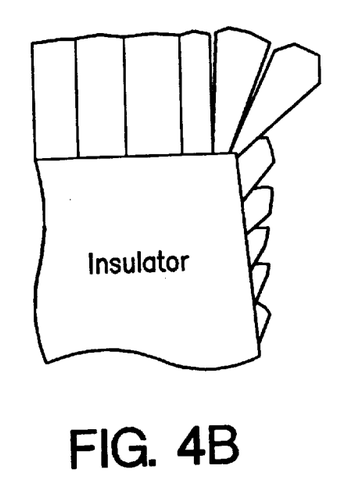
Figure 4C:
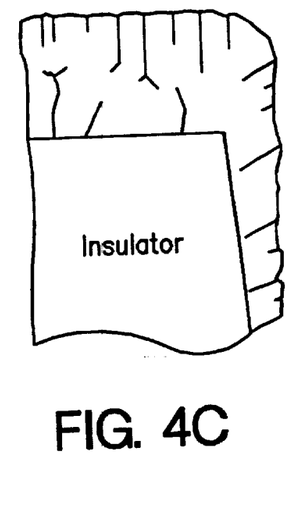
Figure 5:
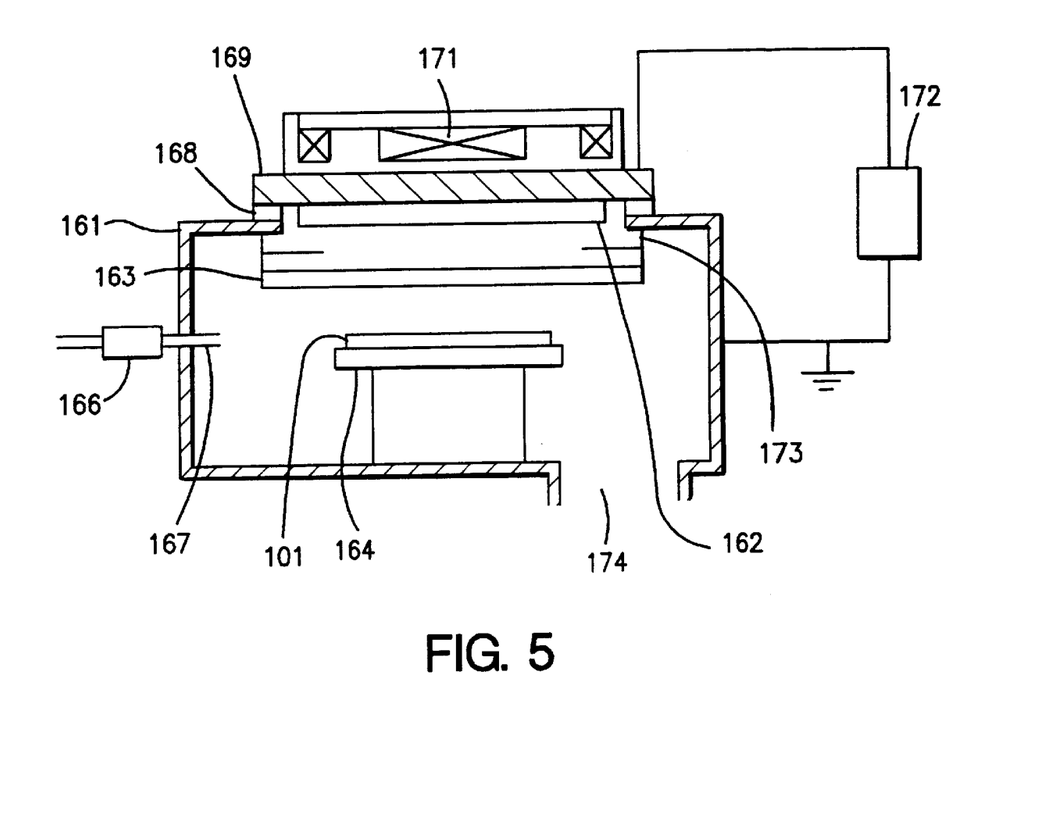
FIG. 5 is a block diagram illustrative of a collimate sputtering system used in accordance with the present invention.

Dependencies of fine structures or mohology of the titanium film deposited by the collimated sputtering are illustrated in FIGS. 4A through 4C. If the temperature of the silicon substrate 101 or the growth temperature is not more than 200° C., then the fine structures or mohology of the titanium film is illustrated in FIG. 4A. If the temperature of the silicon substrate 101 or the growth temperature is in the range of 200° C. to 350° C., then the fine structures or mohology of the titanium film is illustrated in FIG. 4B. If the temperature of the silicon substrate 101 or the growth temperature is not less than 350° C., then the fine structures or mohology of the titanium film is illustrated in FIG. 4C. If the growth temperature is not more than 350° C., then the titanium film has a mohology of sharp pillars and is overhang-shaped at the top edges of the contact hole. The titanium film on the side walls is discontinuous. In this case, the coverage of the titanium nitride film and the tungsten film in the contact hole 105 are deteriorated and the tungsten film is likely to be peeled. For those reasons, it is preferable that the growth temperature of the titanium film 106 is not less than 350° C. On the other hand, if the growth temperature is not more than 350° C., then excess silicidation reaction is caused on the diffusion layer at the bottom of the contact hole. Accordingly, it is preferable that the growth temperature of the titanium film 106 is in the range of 350° C. to 450° C.

Figure 2C:
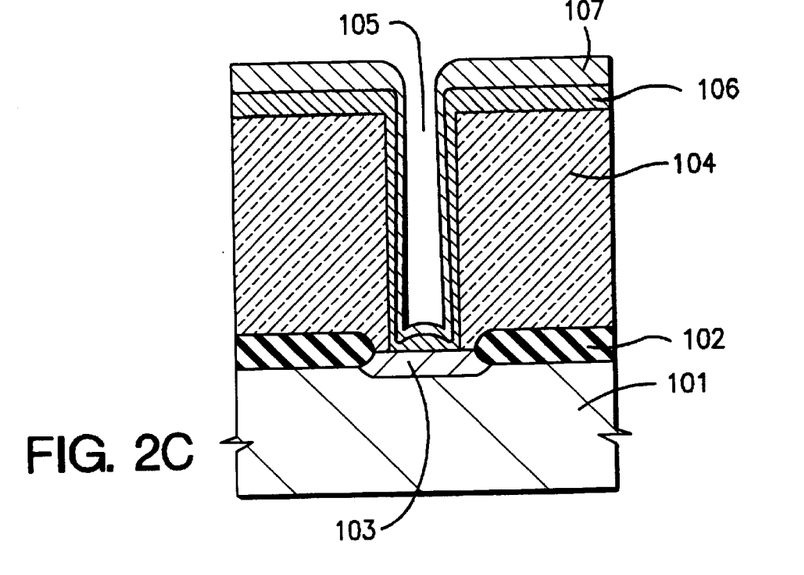

With reference to FIG. 2C, in the sputter chamber 161 illustrated in FIG. 5, a titanium nitride film 107 is entirely deposited by a collimated sputtering method as a reactive sputtering method at a substrate temperature in the range of 300° C. to 450° C. The thickness of the titanium nitride film 107 over the titanium film 106 deposited over the insulation layer 104 is the second thickness t2.

The reactive sputtering method used here is the titanium mode sputtering method which allows that the sputtering rate is higher than the nitration rate of the surface of the titanium target 162 by either increasing the sputtering power or reducing the nitrogen partial pressure. In contrast, if the normal reactive sputtering method is made, under the non-nitration state of the titanium target surface, the titanium nitration on the silicon substrate surface is too slow to obtain the titanium nitride film.

With reference again to FIG. 5, the reactive sputtering by use of the collimated sputtering will be described. Differently from the sputtering for deposition of the titanium film 106, a mixed gas of argon and nitrogen (1:1) is introduced through the gas introduction port 167 into the sputter chamber 161. The mass flow controller 166 controls the gas flow rate so that the internal gas pressure of the sputter chamber 161 is set at about 0.4 Pa. The sputter voltage power supply 172 supplies a power in the range of 6 kW to 12 kW to the sputter chamber 161 for causing the plasma to carry out the sputtering the titanium target. If the sputter power is in the range of 6 kW to 12 kW, then it is possible that a titanium nitride film 107 is deposited on the silicon substrate 101 without nitration of the surface of the titanium target 162. If the sputter power is less than 6 kW, the nitration of the surface of the titanium target 162 is caused. If the sputter power is more than 12 kW, the nitration of the film deposited over the silicon substrate 101 is insufficient.

With reference to FIG. 3, if the aspect ratio is in the range of 2–5, then the bottom coverage is in the range of 35%–5%, for which reason in order to deposit a titanium nitride film 107 having a thickness of 10 nanometers on the bottom of the contact hole, it is required that the thickness t2 of the titanium nitride film 107 over the titanium film 106 over the insulation layer 104 is in the range of 29 nanometers to 200 nanometers. The maximum value of the thickness t1 of the titanium film 106 over the insulation layer 104 is limited by to be 271 nanometers because the thickness limitation of the laminations of the titanium film 106 and the titanium nitride film 107 is not more than 300 nanometers for accurate patterning.

Figure 4D:
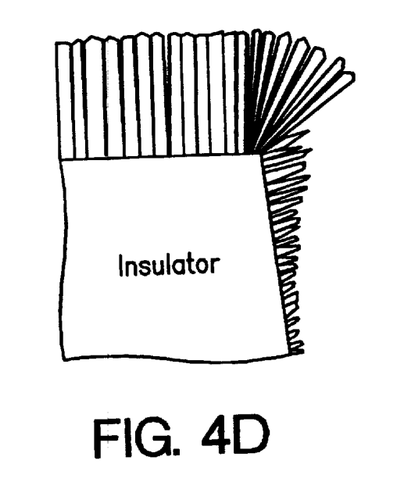
Figure 4E:
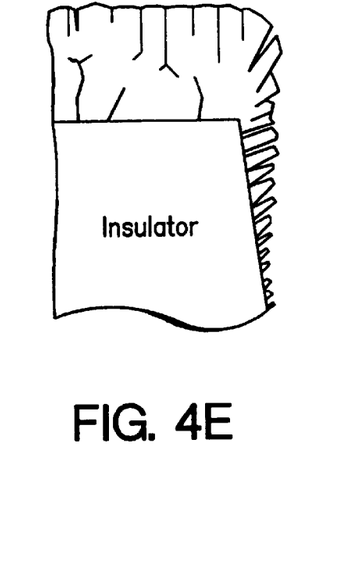

Dependencies of fine structures or mohology of the titanium nitride film deposited by the collimated sputtering are illustrated in FIGS. 4D and 4E. If the temperature of the silicon substrate 101 or the growth temperature is not more than 300° C., then the fine structures or mohology of the titanium film is illustrated in FIG. 4D. If the temperature of the silicon substrate 101 or the growth temperature is not less than 300° C., then the fine structures or mohology of the titanium film is illustrated in FIG. 4E. If the growth temperature is not more than 300° C., then the titanium nitride film has a mohology of sharp pillars and is overhang-shaped at the top edges of the contact hole. The titanium nitride film on the side walls is discontinuous. If the growth temperature is not less than 300° C., then the titanium nitride film has no overhang-shape at the top edges of the contact hole. The titanium nitride film over the titanium film over the insulation layer is continuous. The titanium nitride film on the side walls is, however, discontinuous. Notwithstanding, since the titanium film is continuous, the titanium nitride film discontinuity is not problem. For those reasons, it is preferable that the growth temperature of the titanium nitride film 107 is not less than 300° C. On the other hand, if the growth temperature is not less than 450° C., then excess silicidation reaction is caused on the diffusion layer at the bottom of the contact hole. Accordingly, it is preferable that the growth temperature of the titanium nitride film 107 is in the range of 300° C. to 450° C. Dependence of the titanium film upon the growth temperature also appears on a stress of the titanium nitride film. The stresses of the titanium nitride films grown at room temperature, 200° C., 400° C. are respectively $2\times10^{10}$ dyn/cm$^2$, $1.5\times10^{10}$ dyn/cm$^2$, $1.1\times10^{10}$ dyn/cm$^2$. It is preferable that the stress of the titanium nitride film is in the order of $10^9$ dyn/cm$^2$. This corresponds to the preferable temperature range.

Figure 2D:
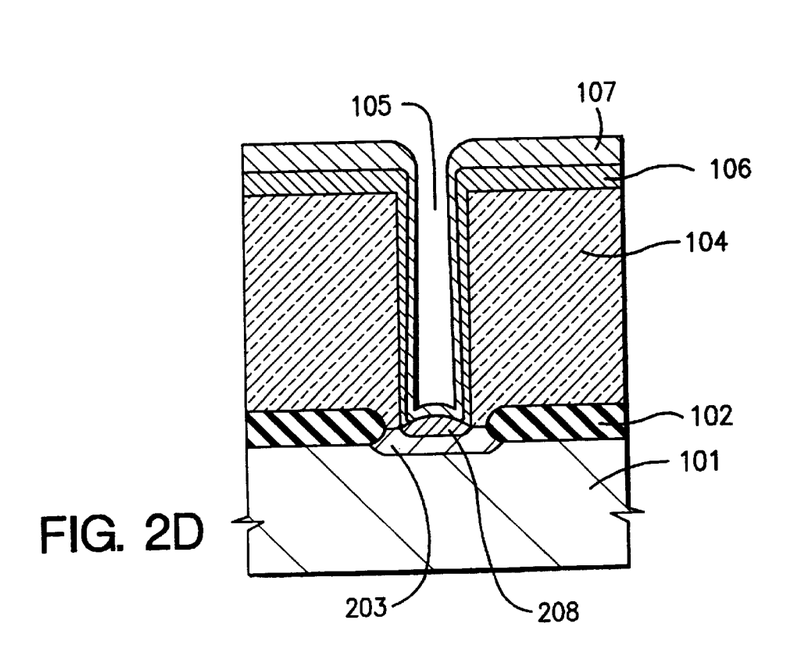

With reference to FIG. 2D, a lamp anneal is carried out at 700° C. for 30 seconds to cause a titanium silicidation of the titanium film 106 having the thickness of about 4 nanometers covering the diffusion layer 103 to form a C49-structured titanium disilicide film 108 having a thickness of 10 nanometers.

Figure 2E:
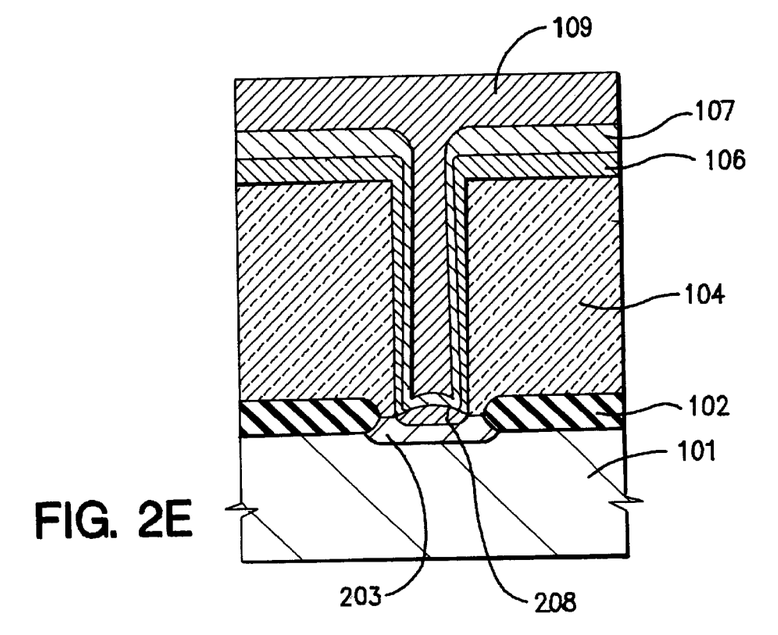

With reference to FIG. 2E, a tungsten film 109 is entirely formed by the blanket chemical vapor deposition. Before the tungsten film 109 will be formed, the titanium nitride film on the titanium silicide film 109 covering the diffusion layer 103 at the bottom of the contact hole 105 has a thickness of at least 10 nanometers. The titanium film 106 continuously extends on the side walls of the contact hole. The titanium film 106 and the titanium nitride film 107 have no overhang shape at the top edges of the contact hole 105. This allows the tungsten film 109 to have barrier ability on and after the growth process. The contact hole 105 is filled with the tungsten film 109 without formation of any cavity therein. Since it is easy to set the thickness of at least 10 nanometers of the titanium silicide film 198 covering the diffusion layer 103 at the bottom of the contact hole 105, the ohmic contact remains obtained.

Thereafter, laminations of the tungsten film 109, the titanium nitride film 107 and the titanium film 106 are patterned to form interconnections, wherein the tungsten film 109 fills up the contact hole 105 and the laminated structures of the titanium film 106 or titanium silicide film 108 and the titanium nitride film 107 still keep the sufficient barrier function. It is further possible that the conductive barrier film has a thickness of not more than 300 nanometers, whereby the accurate patterning can be obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming an interconnection within a contact hole of a high aspect ratio, said method comprising the steps of:

forming a contact hole in an insulation film over a silicon substrate so that a silicon diffusion layer formed on a surface of the silicon substrate is shown through the contact hole;

subjecting the silicon substrate to a first heat treatment at a temperature in a range of 350° C. to 450° C. to deposit a titanium film by a first collimated sputtering process;

subjecting the silicon substrate to a second heat treatment to deposit a titanium nitride film by a second collimated sputtering process;

subjecting the silicon substrate to a third heat treatment to cause a titanium silicidation reaction at a boundary between the titanium film and the silicon diffusion layer thereby forming a C49-structured titanium silicide film on the silicon diffusion layer at a bottom of the contact hole;

forming a conductive film covering the titanium nitride film; and patterning laminations of the conductive film, the titanium nitride film and the titanium film to form an interconnection in the contact hole wherein the silicon substrate is maintained at 700° C. during said step of forming the C49-structured titanium silicide film.

2. The method as claimed in claim 1, wherein the titanium nitride film is deposited at a substrate temperature in a range of 300° C. to 450° C.

3. The method as claimed in claim 1, wherein the titanium film over the insulation film has a first thickness of not less than 9 nanometers and the titanium nitride film over the titanium film deposited over the insulation film has a second thickness of not less than 29 nanometers and further a sum of the first and second thicknesses is not more than 300 nanometers.

4. The method as claimed in claim 1, further comprising the step of removing a spontaneous oxide film from a surface of the silicon diffusion layer shown through the contact hole.

5. The method of claim 1, wherein the high aspect ratio is within a range of 3–5.

6. A method of forming an interconnection within a contact hole of a high aspect ratio, said method comprising the steps of:

forming a contact hole in an insulation film over a silicon substrate so that a silicon diffusion layer formed on a surface of the silicon substrate is shown through the contact hole;

subjecting the substrate to a first heat treatment at a temperature in a range of 350° C. to 450° C. to deposit a titanium film by a first collimated sputtering process;

subjecting the silicon substrate to a second heat treatment in a range of 300° C. to 450° C. to deposit a titanium nitride film by a second collimated sputtering process;

subjecting the silicon substrate to a third heat treatment to cause a titanium silicidation reaction at a boundary between the titanium film and the silicon diffusion layer thereby forming a C-49 structured titanium silicide film on the silicon diffusion layer at a bottom of the contact hole by maintaining the silicon substrate at 700° C. during formation of the C49-structured titanium film;

forming a conductive film covering the titanium nitride film; and patterning laminations of the conductive film, the titanium nitride film and the titanium film to form an interconnection in the contact hole, wherein the titanium film over the insulation film has a first thickness of not less than 9 nanometers and the titanium nitride film over the titanium film deposited over the insulation film has a second thickness of not less than 29 nanometers and further the sum of the first and second thicknesses is not more than 300 nanometers.

7. The method as claimed in claim 6, further comprising the step of removing a spontaneous oxide film from a surface of the silicon diffusion layer shown through the contact hole.

* * * * *